US012607676B2

(12) United States Patent (10) Patent No.: US 12,607,676 B2
Romero (45) Date of Patent: Apr. 21, 2026

(54) OPEN-CIRCUIT SENSORS UTILIZING INDUCTIVE COUPLING

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 156 days.

(21) Appl. No.: 18/609,396

(22) Filed: Mar. 19, 2024

(65) Prior Publication Data

US 2025/0298083 A1 Sep. 25, 2025

(51) Int. Cl.
| *G01R 31/327* | (2006.01) |
| *G01R 15/20* | (2006.01) |
| *G01R 19/165* | (2006.01) |
| *G01R 19/25* | (2006.01) |

(52) U.S. Cl.
CPC ....... *G01R 31/3278* (2013.01); *G01R 15/205* (2013.01); *G01R 19/16571* (2013.01); *G01R 19/25* (2013.01)

(58) Field of Classification Search
CPC .............. G01R 31/3278; G01R 15/205; G01R 19/16571; G01R 19/25
See application file for complete search history.

(56) References Cited

U.S. PATENT DOCUMENTS

| 7,259,545 | B2 | 8/2007 | Stauth et al. |
| 7,518,354 | B2 | 4/2009 | Stauth et al. |
| 7,746,056 | B2 | 6/2010 | Stauth et al. |
| 8,339,134 | B2 | 12/2012 | Chen et al. |
| 8,451,002 | B2 | 5/2013 | Chen et al. |
| 8,542,011 | B2 | 9/2013 | Chen et al. |
| 11,004,638 | B2 * | 5/2021 | Compton ............. H01H 47/002 |
| 11,555,872 | B2 | 1/2023 | Romero |
| 11,624,791 | B2 | 4/2023 | Romero |
| 11,927,650 | B2 | 3/2024 | Romero |

(Continued)

FOREIGN PATENT DOCUMENTS

EP 4 266 070 A1 10/2023

*Primary Examiner* — Feba Pothen
(74) *Attorney, Agent, or Firm* — DALY, CROWLEY, MOFFORD & DURKEE, LLP

(57) ABSTRACT

Systems, circuits, and methods provide for detection of open-circuit states in an external conductor using inductive coupling. An on-chip coil is used to generate a reference magnetic field. An in-package conductor loop is connected to the external conductor. When the external conductor is continuous, the reference magnetic field generates an induced current in the in-package conductor whereas no induced current is generated when the external conductor is broken. The presence of an induced current produces an induced magnetic field, tending to cancel the reference magnetic field. The cancellation or attenuation of the reference magnetic field can be detected by an included magnetic field sensor and a comparator. Examples can include use of a closed loop acting as a feedback loop. The feedback loop can adjust the strength of a feedback magnetic field directed at the magnetic field sensor and used to compensate for nonlinearities of the magnetic field sensor.

45 Claims, 6 Drawing Sheets

(56) References Cited

U.S. PATENT DOCUMENTS

| | | | |
|---|---|---|---|
| 2009/0140726 A1* | 6/2009 | Janke | G01R 33/07 |
| | | | 324/207.13 |
| 2019/0360965 A1* | 11/2019 | Iijima | G01N 27/83 |
| 2022/0236347 A1* | 7/2022 | Romero | G01R 33/0041 |
| 2022/0278520 A1* | 9/2022 | Boury | H01H 47/002 |
| 2023/0204693 A1 | 6/2023 | Romero | |

* cited by examiner

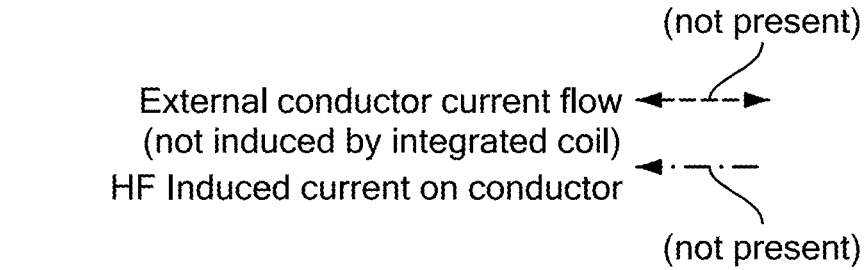
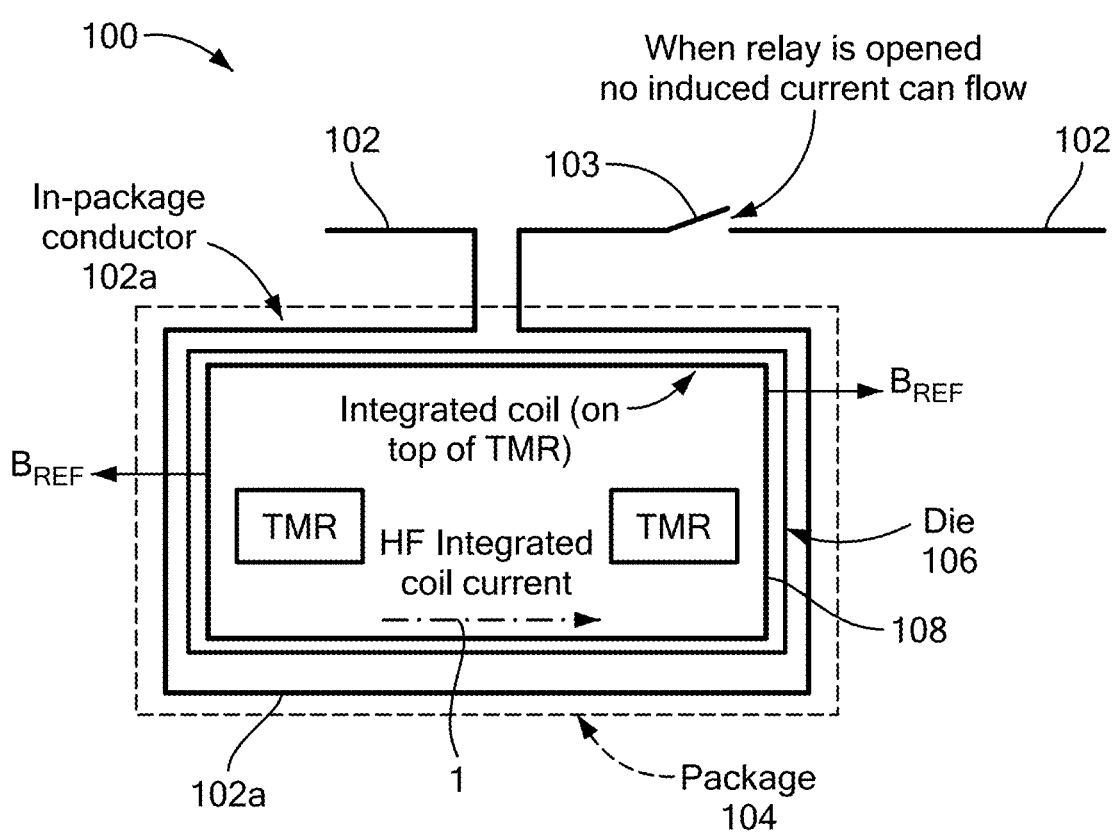
*FIG. 1C*

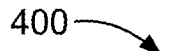

With a first transmitting coil disposed within an integrated circuit (IC) package, producing a reference magnetic field at a reference frequency in response to receiving a drive current, wherein the reference magnetic field is configured to produce an induced current in the conductor when the relay is in the closed state

402

With a first coil driver disposed within the IC package, producing the drive current and providing it to the first transmitting coil

404

With magnetoresistance circuitry disposed within the IC package and configured to sense a net magnetic field as a combination of the reference magnetic field and the induced magnetic field when present, producing an output signal corresponding to the net magnetic field

406

With a main signal path connected to the magnetoresistance circuitry and configured to receive the output signal, determining whether the relay is in a closed or an open state

408

Disposing one or more coils of the conductor in the IC package

OPEN-CIRCUIT SENSORS UTILIZING INDUCTIVE COUPLING

BACKGROUND

In some situations, it may be desirable to know whether a conductor in an electrical circuit is in an open state (physically broken and unable to conduct electricity) or closed state (physically contiguous and able to conduct electricity). As an example, for safety reasons, it may be necessary to know if a conductor, whether by itself or having a closable circuit element such as a relay, is able to conduct current or not. Such knowledge of the conduction state of a conductor or relay may be a specified requirement of various safety standards, e.g., an application safety integration level (ASIL) in accordance with a safety standard such as ISO 26262.

SUMMARY

Aspects of the present disclosure are directed to open-circuit sensor packages, and related methods, using inductive coupling.

One general aspect of the present disclosure includes an inductive open-circuit sensor. The inductive open-circuit sensor can include: a conductor having a relay, where the relay has a closed state allowing current flow within the conductor and an open state preventing current flow within the conductor, and where the conductor includes a coil portion disposed within an integrated circuit (IC) package; a first transmitting coil disposed on an IC die within the IC package and configured to produce a reference magnetic field at a reference frequency in response to receiving a drive current, where the reference magnetic field is configured to produce an induced current in the coil portion of the conductor when the relay is in a closed state; a first coil driver disposed within the IC package and configured to produce the drive current and provide the drive current to the first transmitting coil; magnetoresistance circuitry disposed within the IC package and configured to sense a net magnetic field as a combination of the reference magnetic field and an induced magnetic field generated by the induced current when present and produce an output signal corresponding to the net magnetic field; and a main signal path connected to the magnetoresistance circuitry configured to receive the output signal, where the main signal path is configured to determine, based on the out output signal, whether the relay is in a closed or an open state.

Implementations may include one or more of the following features. The main signal path of the sensor can include a comparator configured to perform a comparison of the output signal to a threshold value. The comparator may be configured to indicate an open state or a closed state of the relay based on the comparison. The main signal path may include a low pass filter configured to receive the output signal. The output signal generated by the first transmitting coil may be a modulated signal in some embodiments or, in other embodiments, an unmodulated (base band) signal. The main signal path may further include a demodulator configured to demodulate the output signal and produce the output signal at baseband. The magnetoresistance circuitry may include a plurality of magnetoresistance (MR or xMR) elements configured in a bridge. The magnetoresistance circuitry may include one or more giant magnetoresistance (GMR) elements. The magnetoresistance circuitry may include one or more an anisotropic magnetoresistance (AMR) elements. The magnetoresistance circuitry may include one or more tunneling magnetoresistance (TMR) elements. The conductor may be configured to conduct (or may be supplied with) current having a frequency in a first frequency band, where the reference frequency of the reference magnetic field is out of the first frequency band. The conductor may be configured to conduct (or may be supplied with) current having a frequency in a first frequency band, where the reference frequency of the reference magnetic field is within the first frequency band, and where the reference frequency is produced with a spread spectrum technique/sequence, e.g., frequency hopping or direct sequence.

The feedback loop may be configured to receive the output signal from the main signal path and produce a feedback magnetic field at the reference frequency, and where the magnetoresistance circuitry is configured to detect the net magnetic field as a combination of the reference magnetic field, the induced magnetic field when present, and the feedback magnetic field. The feedback loop may include a modulator configured to modulate the output signal at a modulation frequency of the reference magnetic field and produce the feedback magnetic field at the reference frequency. The feedback loop may include a gain correction unit configured to receive the output signal and adjust a strength of the feedback magnetic field based on the output signal. The main signal path may include an analog-to-digital converter configured to receive the output signal and produce the output signal as a digital output signal. The feedback loop may be configured to receive the output signal from the main signal path and produce a feedback magnetic field at the reference frequency, where the feedback loop includes a digital-to-analog converter configured to receive the digital output signal and produce the output signal as an analog signal for driving the second transmitting coil.

Another general aspect of the present disclosure includes a method of detecting an open circuit state of a conductor using an inductive sensor. The method can include: with a first transmitting coil disposed on an integrated circuit (IC) die within an IC package, producing a reference magnetic field at a reference frequency in response to receiving a drive current, where the reference magnetic field is configured to produce an induced current in the conductor when the relay is in the closed state; with a first coil driver disposed within the IC package, producing the drive current and providing it to the first transmitting coil; with magnetoresistance circuitry disposed within the IC package and configured to sense a net magnetic field as a combination of the reference magnetic field and an induced magnetic field generated by the induced current when present, producing an output signal corresponding to the net magnetic field; and, with a main signal path connected to the magnetoresistance circuitry and configured to receive the output signal, determining whether the relay is in the closed state or the open state.

Implementations may include one or more of the following features. The conductor can include a coil portion disposed within the IC package. The inductive sensor can include a feedback loop including a second coil and a second coil driver, where the feedback loop is configured to receive the output signal from the main signal path and produce a feedback magnetic field at the reference frequency, and where the magnetoresistance circuitry is configured to detect the net magnetic field as a combination of the reference magnetic field, the induced magnetic field when present, and the feedback magnetic field. The method may include adjusting a strength of the feedback magnetic field based on an ambient temperature change of the magnetoresistance circuitry. The conductor may be configured to conduct (or supplied with) current having a frequency in a first frequency band, where producing the reference magnetic field includes producing the reference magnetic field with the reference frequency out of the first frequency band. The conductor may be configured to conduct (supplied with) current having a frequency in a first frequency band, where producing the reference magnetic field includes producing the reference magnetic field with the reference frequency within the first frequency band and with a spread spectrum sequence. The main signal path may include a comparator configured to perform a comparison of the output signal to a threshold value for determining whether the relay is in the closed state or the open state, and where the comparator is configured to produce an output signal indicative of a conduction state of the conductor.

A further general aspect of the present disclosure includes an inductive sensor for sensing an open-circuit state of a conductor. The inductive sensor can include: an integrated circuit (IC) disposed adjacent the conductor, the IC disposed on a die and including, a transmitting coil disposed within the IC and configured to produce a reference magnetic field at a reference frequency in response to receiving a drive current; a coil driver circuit disposed within the IC and configured to produce the drive current and provide it to the transmitting coil; magnetic field sensing circuitry including one or more magnetic field sensing elements disposed within the IC and configured to sense a net magnetic field as a combination of the reference magnetic field and an induced magnetic field generated by an induced current in the conductor when present and produce an output signal corresponding to the net magnetic field; and a main signal path connected to the magnetic field sensing circuitry configured to receive the output signal, where the main signal path is configured to determine, based on the out output signal, whether the conductor is in a closed (physically continuous or unbroken) state in which it is able to conduct current or in an open (discontinuous or broken) state in which it is unable to conduct a current.

Implementations may include one or more of the following features. The IC may be disposed in an IC package. The IC package may include an in-package portion of the conductor. The in-package portion of the conductor may include one or more coils. The one or more magnetic field sensing elements may include a plurality of magnetic field sensing elements configured in a bridge. The plurality of magnetic field sensing elements may include giant magnetoresistance (GMR) elements. The plurality of magnetic field sensing elements may include anisotropic magnetoresistance (AMR) elements. The plurality of magnetic field sensing elements may include tunneling magnetoresistance (TMR) elements. The plurality of magnetic field sensing elements may include Hall effect elements. The feedback loop may be configured to receive the output signal from the main signal path and produce a feedback magnetic field at the reference frequency, where the magnetic field sensing circuitry is configured to detect the net magnetic field as a combination of the reference magnetic field, the induced magnetic field when present, and the feedback magnetic field. The main signal path may include a comparator configured to perform a comparison of the output signal to a threshold value. In some embodiments, the comparator may be configured to indicate the open state of the conductor when the comparison indicates that the output signal exceeds the threshold value. In some embodiments, the comparator may be configured to indicate the closed state of the conductor when the comparison indicates that the output signal is less than the threshold value.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIGS. 1A-1C show an example system for determining a conduction state of a conductor using inductive coupling, in different conduction states, respectively, in accordance with the present disclosure;

FIG. 4 shows steps in an example method of determining a conduction state of a conductor using inductive coupling, in accordance with the present disclosure.

DETAILED DESCRIPTION

Figure 1A:
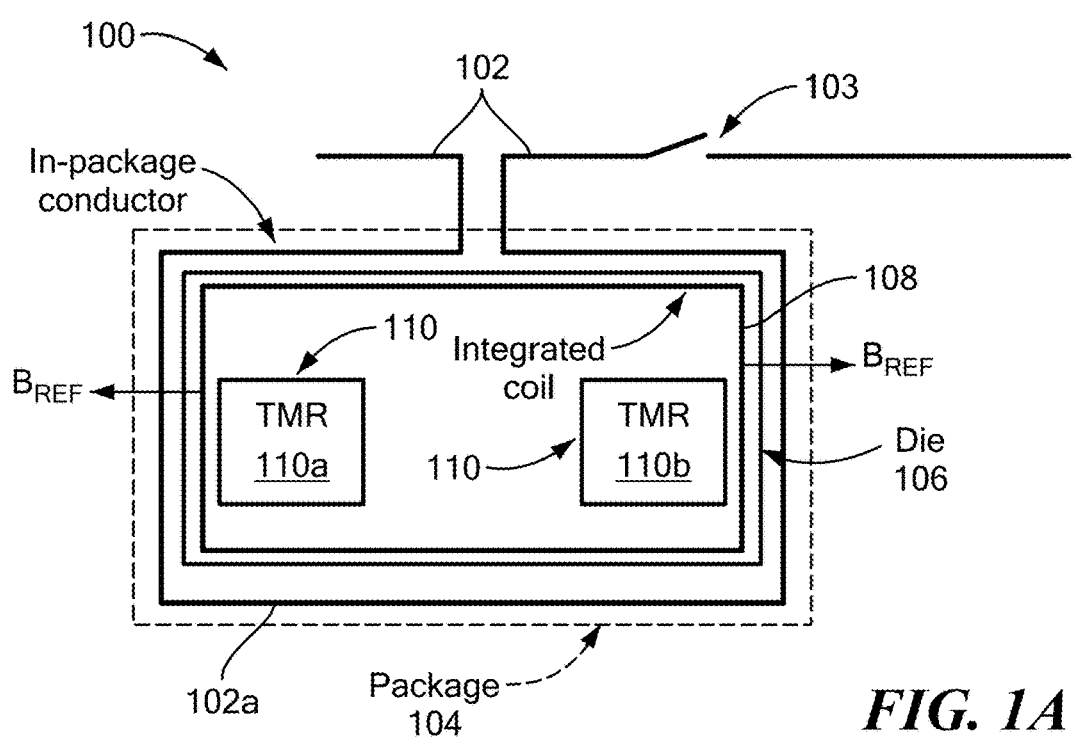

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, circuits, and methods providing detection of open-circuit or broken-circuit (no-conduction) states using inductive coupling. Embodiments of the present disclosure provide the ability to detect the state of a relay connected in series with an external conductor, without detecting the mechanical position of the relay, or similarly, the physical continuity of the external conductor, even in the absence of current flow in the external conductor. It should be noted that the relay state or continuity of the external conductor cannot simply be inferred from sensing current in the external conductor, since there might be no current flowing from an external source while the relay is closed or the external conductor has continuity.

In some examples and embodiments of the present disclosure, an integrated coil (e.g., integrated in a die having a field-based current sensor) is used to generate and emit a reference magnetic field, e.g., a high frequency (HF) magnetic field, which is used to induce a current in an adjacent conductor, e.g., an in-package conductor with a loop shape of a similar area as the emitting coil. The in-package conductor can form or be configured as a loop that is connected to the external conductor under examination, e.g., an external conductor having a relay or external conductor forming a continuous conductive path.

If the external conductor is continuous and able to conduct a current (i.e., the relay is closed or the external conductor is unbroken), the reference magnetic field is able to induce an induced current in the in-package conductor. The induced current, due to Lenz's law will have a direction opposing the current in the integrated coil such that the induced current generates an induced field ($B_{IND}$) countering (or tending to counter) the one emitted by the integrated coil. This will happen as long as the circuit is externally closed, i.e., the relay state is closed or the external conductor is continuous and able to conduct a current. Consequently, if there is an integrated magnetic field transducer (sensor), when the field is effectively induced in the in-package conductor, such transducer will see little to no field coming from the integrated emitting coil. This is because the field from the in-package conductor counters (counterbalances) such field from the integrated coil.

Conversely, if the relay is open or the external conductor is otherwise discontinuous, no current can be induced in the in-package loop and, therefore, no induced magnetic field is present to counter the reference magnetic field. The magnetic field sensor in such a case will detect a full reference-field signal from the integrated emitting coil.

Figure 1B:
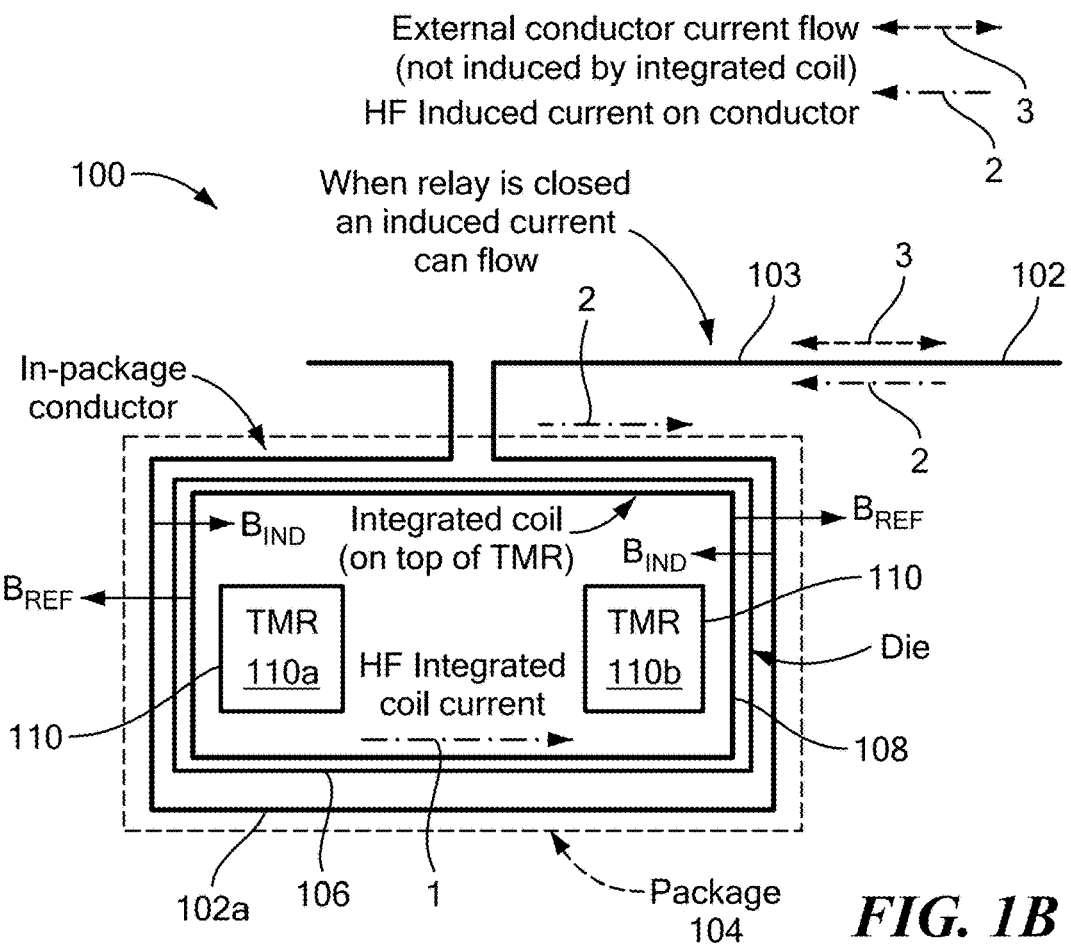

FIGS. 1A-1C show an example system 100 for determining a conduction state of a conductor using inductive coupling, including for two different conduction states, in accordance with the present disclosure.

As shown in FIG. 1A, system 100 includes a conductor 102 having a relay 103. System (circuit) 100 further includes a semiconductor package 104, a.k.a., integrated circuit (IC) package. Package 104 is shown including an in-package portion 102a of conductor 102 configured as a loop or coil (one or more loops, turns, or windings). Package 104 includes a semiconductor die 106, a.k.a., IC die. An integrated coil 108 is disposed on IC die 106. IC die 106 also includes one or more magnetic field (field-based) sensors 110, each having one or more magnetic field sensing elements, e.g., TMR elements or Hall effect elements. Die 106 may include other components and connections that are not shown, e.g., one or more processors, one or more memories, one or more amplifiers, one or more filters (e.g., low-pass filters), one or more comparators, etc.

For the embodiment shown, two magnetic field sensing elements 110a-110b are indicated. In some embodiments magnetic field sensing elements 110a-b may each include multiple magnetic field sensing elements (e.g., pairs of elements). In some embodiments, one or more magnetoresistance (xMR) elements may be used for magnetic field sensor 110; the nomenclature "xMR" can generally refer to different types of MR elements, e.g., TMR, GMR, AMR, etc. While field sensing elements 110a-110b are indicated as TMR elements, other types of MR elements may be used instead for other embodiments. In some embodiments, Hall effect elements may be used for sensor 110, e.g., as elements 110a-110b. FIGS. 1B-1C, described below, illustrate general operation of system 100.

FIG. 1B shows a closed-circuit state for system 100. In this state, relay 103 is shown as closed, a state where conduction is possible in the external conductor 102. Consequently, the emitted field ($B_{REF}$) produced by the current 1 in integrated coil 108 will be able to induce a current (induced current 2) on the in-package loop 102a. The induced current 2 is shown traveling in a direction opposed to current 1, due to Lenz's Law. The induced current 2 produces a corresponding magnetic field ($B_{IND}$), which counters the reference magnetic field ($B_{REF}$). Accordingly, the summed (superposed) magnetic field at sensor 110, at the reference frequency, is zero or close to zero. As a result, the integrated magnetic transducer 110 will not sense/detect the reference magnetic field $B_{REF}$ emitted by the integrated coil 108, because the countering induced field $B_{IND}$ is present. This assumes the frequency of the reference current 1 is selected to be out of band of any current in the external conductor 102; for situations where the reference current 1 has a frequency shared by current in the external conductor 102, spread spectrum techniques can be applied to isolate (filter) the induced magnetic field from field components generated by the external current 3 carried by the external conductor 102, as described in further detail below.

FIG. 1C shows an open-circuit state (condition) for system 100. In this state, the relay is shown as opened meaning that the external conductor 102 cannot conduct a current (i.e., is in a non-conductive state). Consequently, the emitted field ($B_{REF}$) produced by the integrated coil 108 will not be able to induce a current on the in-package loop 102a (which is connected to the external conductor 102). As a result, the integrated magnetic transducer 110 will sense/detect the full reference magnetic field $B_{REF}$ emitted by the integrated coil 108, since no countering field is present.

In some embodiments, as described in further detail below, relay 103 may be omitted and instead a portion of the external conductor may be monitored (interrogated) by the reference magnetic field. Monitoring of a portion of the external conductor may be particularly beneficial in circumstances where the external conductor may be subject to a physical discontinuity for whatever reason, e.g., being mechanically severed/broken, burned out through excessive current, etc.

Figure 2:
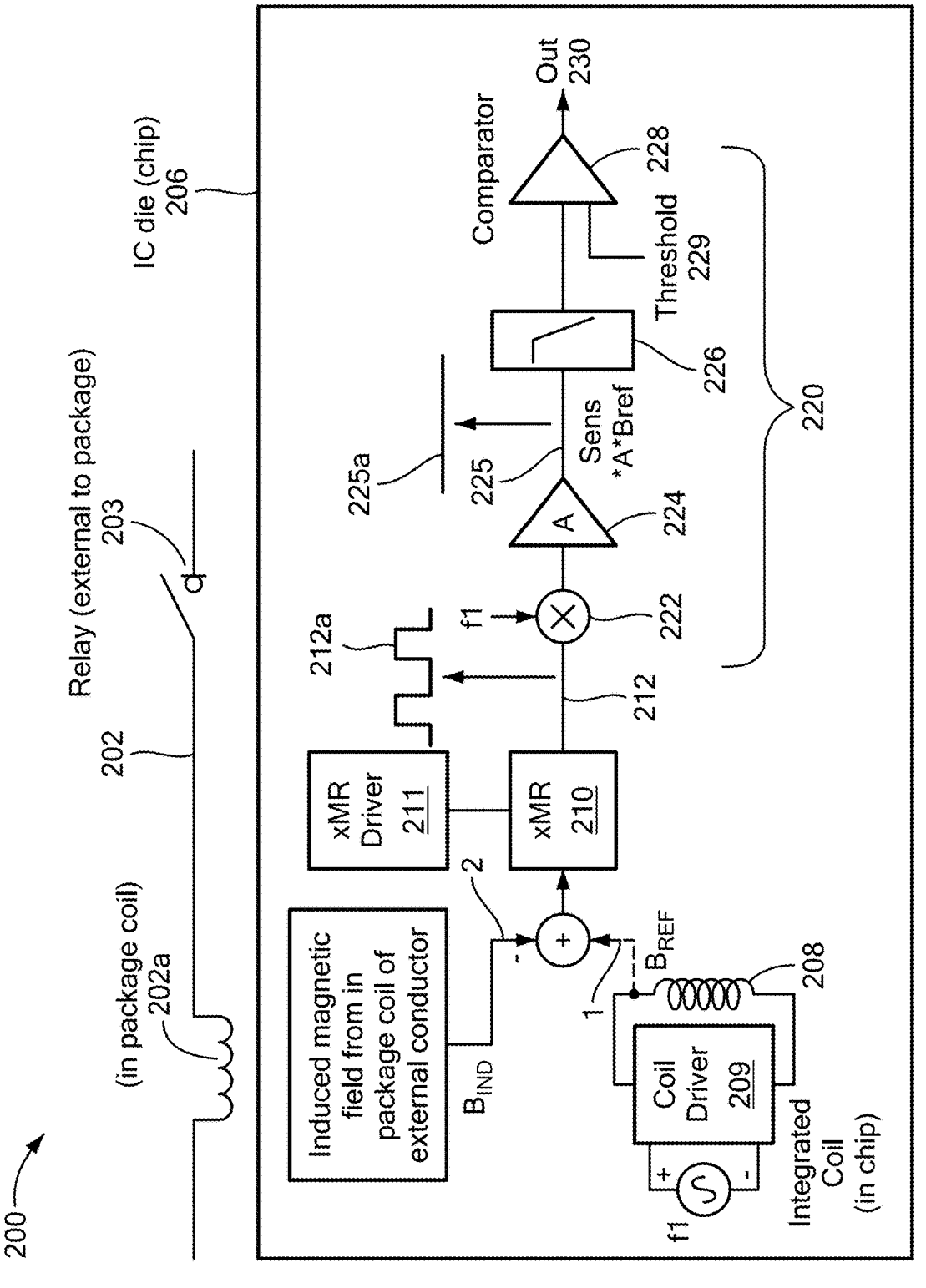
FIG. 2 shows a further example system for determining a conduction state of a conductor using inductive coupling, in accordance with the present disclosure.

FIG. 2 shows a further example system 200 for determining a conduction state of a conductor using inductive coupling, in accordance with the present disclosure.

System 200 is shown including a conductor 202 with an in-package coil 202a portion and a relay 203. System 200 includes an IC die (a.k.a., semiconductor die or chip) 206 including a coil 208 and coil driver 209. The coil driver 209 is configured to drive the coil 208 at a reference or modulation frequency, $f_1$, such that coil 208 produces a reference magnetic field ($B_{REF}$) 1 at the reference (modulation) frequency. System 200 also includes one or more magnetic field sensing (field-based) elements configured as a magnetic field sensor, shown as xMR 210, and corresponding driver 211. The magnetic field sensor 210 is configured to sense the reference magnetic field 1 and any induced magnetic field ($B_{IND}$) 2 from the in-package coil portion 202a of the conductor 202. In some embodiments, sensor 210 can include four TMR elements configured as an MR bridge, sensing a differential in the plane field created by the emitting coil, or the addition of such a field and the one induced in the in-package conductor when relay 203 is closed. While the reference magnetic field is indicated as being a modulated field (signal) at $f_1$, in other embodiments, the reference magnetic field may be a base band field (signal).

Combined (superposed) magnetic fields including both $B_{REF}$ and $B_{IND}$ are indicated by the sum junction shown, with $B_{IND}$ countering (or being the opposite of) $B_{REF}$. The magnetic field sensor 210, indicated as xMR 210, produces an output signal 212 shown with amplitude 212$a$. Output signal 212 is provided along an output path to demodulator 222 for demodulation. Assuming the coil driver 209 emits a field at $f_1$, demodulator 222 demodulates the net field component at such frequency $f_1$, bringing the output signal to base band.

Demodulator 222 provides its output, the demodulated output signal, to an amplifier 224 for amplification. As shown, the signal after amplification (with gain, A) 225 has an amplitude (shown as 225$a$) equal to the sensitivity (Sens) of the magnetic field sensor xMR 210, times the gain A, times the sum ($\Sigma$B) of the reference magnetic field, $B_{REF}$, and induced magnetic field, $B_{IND}$, (when present) at the magnetic field sensor 210. A low-pass filter 226 can be included on the signal path as shown. After amplification by amplifier 224 and low-pass filtering (LPF) by filter 226, comparator 228 compares the resulting signal against a threshold to determine whether an open state or closed state exists for the conductor 202, e.g., at relay 203.

One possible set of scenarios is as follows for the comparison by comparator 228: (i) if the detected signal is higher than the threshold 229, then relay 203 is in an open (nonconductive) state since there is no induced field counterbalancing the one emitted by the integrated coil 209; or (ii) if the detected signal is smaller than the threshold 229, then relay 203 is in a closed (conductive) state (or conductor 202 in unbroken) because there is an induced field counterbalancing the reference field emitted by the integrated coil 208. Comparator 228 can produce an output signal 230 indicative of the conduction state of the external conductor 202, e.g., an open-circuit state preventing conduction of current, or a closed-circuit (continuous) circuit state allowing conduction of current.

Other embodiments of the present disclosure can provide higher accuracy, if required or desired, by including integrated magnetic closed (feedback) loops to mitigate non-idealities in the transfer function of the field-based sensor(s) employer. One example is shown in FIG. 3.

Figure 3:
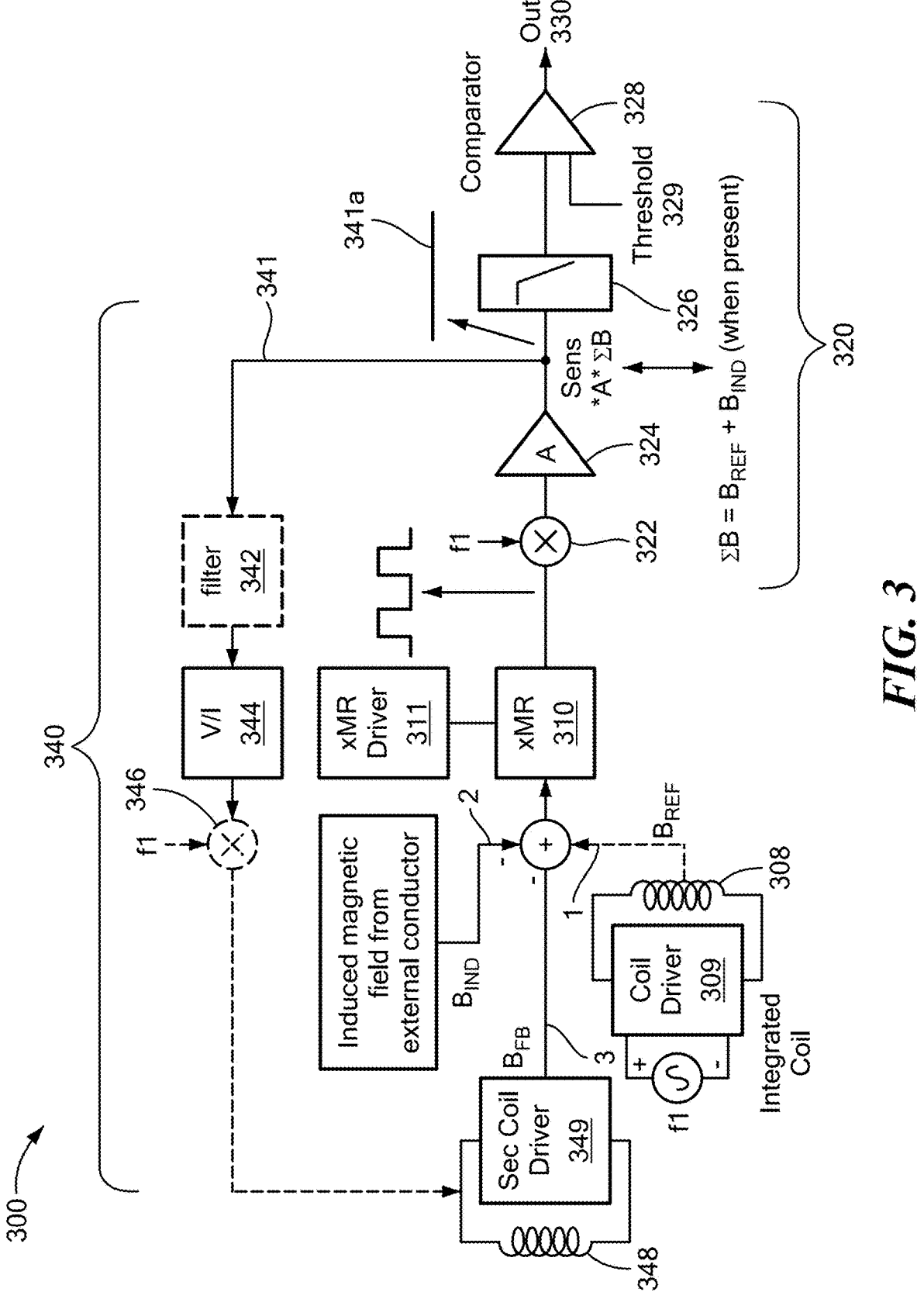
FIG. 3 is a diagram showing an example system for determining a conduction state of a conductor using inductive coupling including a feedback loop, in accordance with the present disclosure.

FIG. 3 is a diagram showing an example system 300 for determining a conduction state of a conductor using inductive coupling including a feedback loop, in accordance with the present disclosure. System 300 is similar to system 200 of FIG. 2 but additionally includes a feedback loop 340 that can adjust the gain of the magnetic field sensor 310 and thereby compensate for nonlinearities in the transfer function of the magnetic field sensor 310.

System 300 includes an external conductor with an in-package coil portion (not shown) and a relay (not shown). System 300 also includes an IC die (a.k.a., semiconductor die or chip) 306 including a coil 308 and coil driver 309. The coil driver 309 is configured to drive the coil 308 at a reference or modulation frequency, $f_1$, such that coil 308 produces a reference magnetic field ($B_{REF}$) 1 at the reference (modulation) frequency. System 300 also includes one or more magnetic field sensing (field-based) elements configured as a magnetic field sensor, shown as xMR 310, and corresponding driver 311. The magnetic field sensor 310 is configured to sense the reference magnetic field 1 and any induced magnetic field ($B_{IND}$) 2 from the in-package coil portion 302$a$ of the conductor 302.

Combined (superposed) magnetic fields including both $B_{REF}$ and $B_{IND}$ are indicated by the sum junction shown, with $B_{IND}$ 2 countering (or being the opposite of) $B_{REF}$1; an additional field, $B_{FB}$ 3, produced by the feedback loop 340 is shown combined with the other fields. The magnetic field sensor 310 produces an output signal 312 shown with amplitude 312$a$. Output signal 312 is provided along an output path to demodulator 322 for demodulation. Assuming the coil driver 309 emits a field at $f_1$, demodulator 322 demodulates the net field component at such frequency $f_1$, bringing the output signal to base band.

Demodulator 322 provides its output, the demodulated output signal, to an amplifier 324 for amplification. As shown, the signal after amplification (with gain, A) by amplifier 324 has an amplitude (shown as 341$a$) equal to the feedback loop gain 1/K, where K is the feedback or secondary coil 348 coupling factor in G/A, times the sum ($\Sigma$B) of the reference magnetic field, $B_{REF}$, and induced magnetic field, $B_{IND}$, (when present) at the magnetic field sensor 310 Since, for the scenario shown, there is a negative feedback loop, the output signal amplitude is dictated by the closed loop gain of the system in this case (the negative feedback loop is used in order to get rid of the errors associated with the sensitivity of the field sensor, e.g., TMR, and thus make it independent of such sensitivity): the closed loop gain of the system is 1/K, where K is the feedback coil 349 magnetic coupling factor measured in G/A, if the output signal of the loop is current. If a current to voltage conversion for the output signal is desired then the overall gain will be 1/(K*gm), where gm is the V to I conversion factor (not shown in FIG. 3).

After amplification by amplifier 324 and low-pass filtering (LPF) by filter 326, comparator 328 compares the resulting signal against a threshold to determine whether an open state or closed state exists for the conductor 302, e.g., at relay 303. Comparator 328 can produce a corresponding output signal 330.

Feedback loop 340 includes filter 342, gain adjustment block 344, modulator 346, secondary coil 348, and coil driver 349. Secondary coil 38 produces feedback field ($B_{FB}$) 3 which is sensed by sensor 310. Feedback loop 340 can take the output signal 341, shown with amplitude 341, and use it for providing feedback to adjust the $B_{FB}$ such that the sum of all the magnetic components applied to the xMR element is as small as possible (to minimize any residual signal). Such negative feedback operation can be used to compensate for nonlinearities in the transfer function of the magnetic field sensor 310. Examples of such nonlinearities include but are not limited to sensitivity temperature dependent drift, nonlinear frequency response, nonlinear sensitivity, etc.

Embodiments of the present disclosure (e.g., similar to those shown and described for FIGS. 2-3) can also include analog to digital (A/D) conversion before the comparator, in which cases such comparison would be done in the digital domain with digital components.

Regarding the selection of the reference frequency used, $f_1$, it may be preferable to be at a frequency such that it is out of the frequency band in which the external conductor current flow occurs. In some cases, such frequency content of the conductor current may be relatively wide, taking a significant bandwidth. As a consequence, choosing $f_1$ to be out of band may pose a challenge. In some embodiments, as noted previously, spread spectrum techniques can be used to ease conditions placed on the reference frequency $f_1$. For example, for in-band detection of the relay (conduction) state or conduction states (continuity) of the external conductor, a spread spectrum sequence can be used, using a short pulse or sequence of pulses emitted by the integrated coil as an interrogation pulse or pulses: although in the same frequency band, the pseudo-random nature of the interrogation pulse or pulses can still be detected even in the presence of external current flow (in the same frequency band), while at the same time not significantly interfering with such current-flow frequency-content.

Moreover, the emitted magnetic field levels are relatively small, and consequently, so too the induced currents, compared with the external current flow that might be detected typically by a current sensor. TMR elements may be preferable in some embodiments due to the relatively high sensitivity of such field-based elements and good resolution in detecting small magnetic fields.

FIG. 4 shows steps in an example method 400 of determining a conduction state of a conductor using inductive coupling, in accordance with the present disclosure. Method 400 can include, with a first transmitting coil disposed within an integrated circuit (IC) package, producing a reference magnetic field at a reference frequency in response to receiving a drive current, wherein the reference magnetic field is configured to produce an induced current in the conductor when the relay is in the closed state, as described at 402. With a first coil driver disposed within the IC package, the drive current can be produced and provided to the first transmitting coil, as described at 404. With magnetoresistance circuitry disposed within the IC package and configured to sense a net magnetic field as a combination of the reference magnetic field and the induced magnetic field when present, an output signal corresponding to the net magnetic field can be produced, as described at 406. With a main signal path connected to the magnetoresistance circuitry and configured to receive the output signal, a conduction state of the external conductor can be determined, e.g., whether the relay is in a closed or an open state or the external conductor is in a broken (non-conductive) state or a continuous (conductive) state, as described at 408. Method 400 can optionally include disposing or positioning one or more coils (of or connected to the external conductor) in the IC package, as described at 410.

Figure 5:
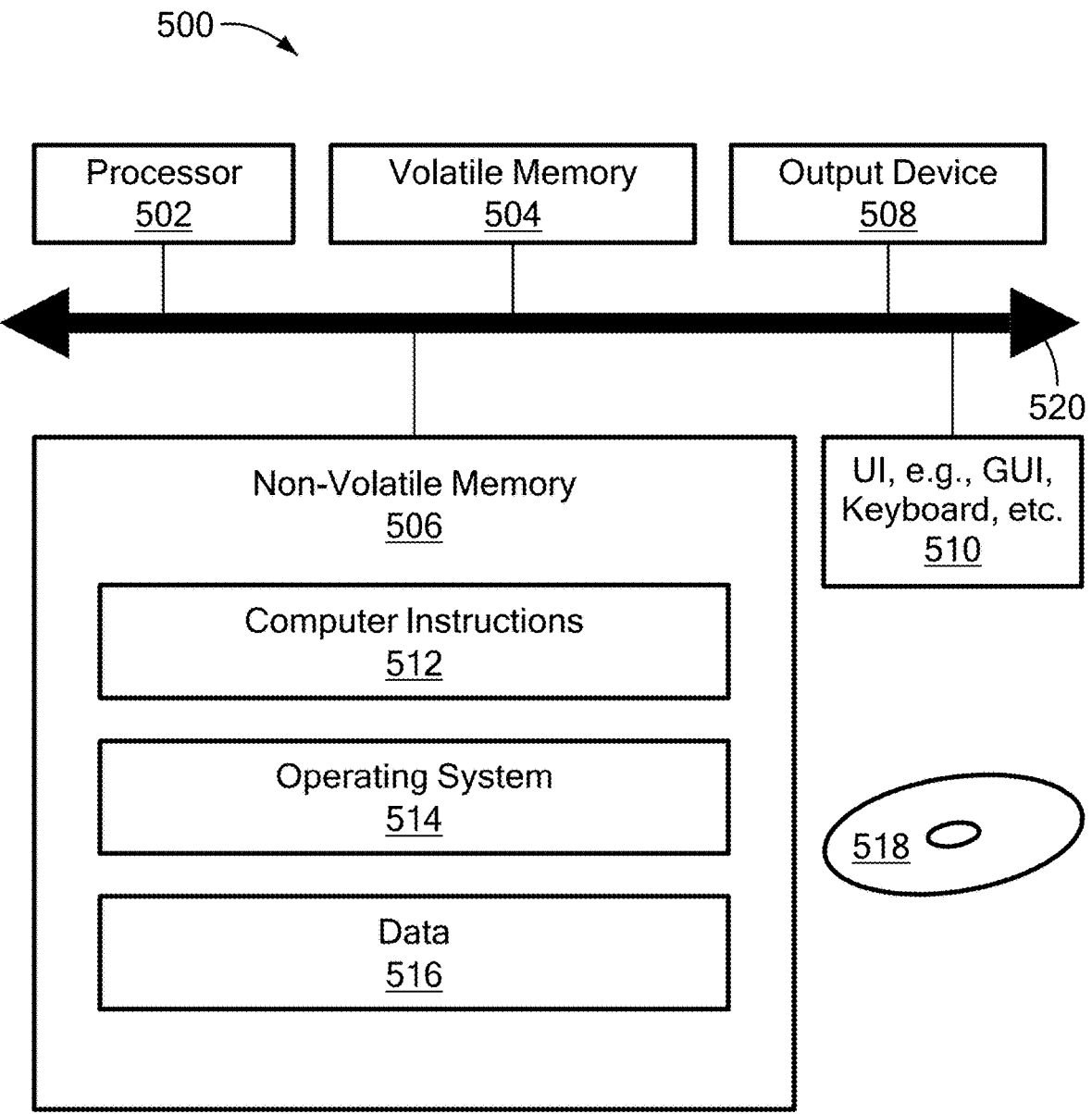
FIG. 5 is a block diagram of an example computer system operative to perform processing, in accordance with the present disclosure.

FIG. 5 is a block diagram of an example computer system 500 operative to perform processing, in accordance with the present disclosure. Computer system 500 can perform all or at least a portion of the processing, e.g., steps in algorithms and methods, described herein. The computer system 500 includes a processor 502, a volatile memory 504, a non-volatile memory 506 (e.g., hard disk, etc.), an output device 508 and a user input or interface (UI) 510, e.g., graphical user interface (GUI), a mouse, a keyboard, a display, and/or any common user interface, etc. The non-volatile memory (non-transitory storage medium) 506 stores computer instructions 512 (a.k.a., machine-readable instructions or computer-readable instructions) such as software (computer program product), an operating system 514 and data 516. In some examples/embodiments, the computer instructions 512 can be executed by the processor 502 out of (from) volatile memory 504. In some examples/embodiments, an article 518 (e.g., a storage device or medium such as a hard disk, an optical disc, magnetic storage tape, optical storage tape, flash drive, etc.) includes or stores the non-transitory computer-readable instructions. Bus 520 is also shown. In some embodiments, one or more components of system 500 can be disposed on or connected to one or more integrated circuits on one or more semiconductor die.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 500 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as special purpose logic circuitry, e.g., an FPGA (field programmable gate array) and/or an ASIC (application-specific integrated circuit). In some examples, digital logic circuitry, e.g., one or more FPGAs, can be operative as one or more processors as described herein.

Accordingly, embodiments of the inventive subject matter can afford various benefits relative to prior art techniques. For example, embodiments and examples of the present disclosure can enable or facilitate e.g., systems and components with improved reliability and/or achieving or obtaining an Application Safety Integration Level (ASIL) in accordance with a safety standard such as ISO 26262.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while the emitting (transmitting) coil for a reference magnetic field has been described herein for certain embodiments as being disposed or included in an IC die, in other embodiments the emitting coil for the reference magnetic field may be disposed outside of an IC die, e.g., within the IC package.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more," "a plurality," and "at least one" indicate any integer number greater than or equal to one, i.e., one, two, three, four, etc.; though, where context admits, each of those terms may reference a fractional value greater than one, e.g., a coil may have a fractional number of turns or windings with that fractional number of turns being referred to as "one or more," "a plurality," or "at least one". The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal," "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. An inductive open-circuit sensor comprising:
a conductor having a relay, wherein the relay has a closed state allowing current flow within the conductor and an open state preventing current flow within the conductor, and wherein the conductor includes a coil portion disposed within an integrated circuit (IC) package;
a first transmitting coil disposed on an IC die within the IC package and configured to produce a reference magnetic field at a reference frequency in response to receiving a drive current, wherein the reference magnetic field is configured to produce an induced current in the coil portion of the conductor when the relay is in a closed state;

a first coil driver disposed within the IC package and configured to produce the drive current and provide the drive current to the first transmitting coil;

magnetoresistance circuitry disposed within the IC package and configured to sense a net magnetic field as a combination of the reference magnetic field and an induced magnetic field generated by the induced current when present and produce an output signal corresponding to the net magnetic field; and a main signal path connected to the magnetoresistance circuitry configured to receive the output signal, wherein the main signal path is configured to determine, based on the out output signal, whether the relay is in a closed or an open state, wherein the conductor is configured to conduct current having a frequency in a first frequency band, wherein the reference frequency of the reference magnetic field is out of the first frequency band.

2. The sensor of claim 1, wherein the main signal path includes a comparator configured to perform a comparison of the output signal to a threshold value.

3. The sensor of claim 2, wherein the comparator is configured to indicate an open state of the relay based on the comparison.

4. The sensor of claim 1, wherein the output signal generated by the first transmitting coil is a modulated signal.

5. The sensor of claim 4, wherein the main signal path further includes a demodulator configured to demodulate the output signal and produce the output signal at baseband.

6. The sensor of claim 2, wherein the main signal path further comprising a low pass filter configured to receive the output signal.

7. The sensor of claim 1, wherein the magnetoresistance circuitry comprises a plurality of magnetoresistance (MR) elements configured in a bridge.

8. The sensor of claim 7, wherein the magnetoresistance circuitry comprises one or more giant magnetoresistance (GMR) elements.

9. The sensor of claim 7, wherein the magnetoresistance circuitry comprises one or more an anisotropic magnetoresistance (AMR) elements.

10. The sensor of claim 7, where the magnetoresistance circuitry comprises one or more tunneling magnetoresistance (TMR) elements.

11. An inductive open-circuit sensor comprising:

a conductor having a relay, wherein the relay has a closed state allowing current flow within the conductor and an open state preventing current flow within the conductor, and wherein the conductor includes a coil portion disposed within an integrated circuit (IC) package;

a first transmitting coil disposed on an IC die within the IC package and configured to produce a reference magnetic field at a reference frequency in response to receiving a drive current, wherein the reference magnetic field is configured to produce an induced current in the coil portion of the conductor when the relay is in a closed state;

a first coil driver disposed within the IC package and configured to produce the drive current and provide the drive current to the first transmitting coil;

magnetoresistance circuitry disposed within the IC package and configured to sense a net magnetic field as a combination of the reference magnetic field and an induced magnetic field generated by the induced current when present and produce an output signal corresponding to the net magnetic field; and a main signal path connected to the magnetoresistance circuitry configured to receive the output signal, wherein the main signal path is configured to determine, based on the out output signal, whether the relay is in a closed or an open state, wherein the conductor is configured to conduct current having a frequency in a first frequency band, wherein the reference frequency of the reference magnetic field is within the first frequency band, and wherein the reference frequency is produced with a spread spectrum sequence.

12. An inductive open-circuit sensor comprising:

a conductor having a relay, wherein the relay has a closed state allowing current flow within the conductor and an open state preventing current flow within the conductor, and wherein the conductor includes a coil portion disposed within an integrated circuit (IC) package;

a first transmitting coil disposed on an IC die within the IC package and configured to produce a reference magnetic field at a reference frequency in response to receiving a drive current, wherein the reference magnetic field is configured to produce an induced current in the coil portion of the conductor when the relay is in a closed state;

a first coil driver disposed within the IC package and configured to produce the drive current and provide the drive current to the first transmitting coil;

magnetoresistance circuitry disposed within the IC package and configured to sense a net magnetic field as a combination of the reference magnetic field and an induced magnetic field generated by the induced current when present and produce an output signal corresponding to the net magnetic field;

a main signal path connected to the magnetoresistance circuitry configured to receive the output signal, wherein the main signal path is configured to determine, based on the out output signal, whether the relay is in a closed or an open state; and a feedback loop including a second transmitting coil and a second coil driver, wherein the feedback loop is configured to receive the output signal from the main signal path and produce a feedback magnetic field at the reference frequency, and wherein the magnetoresistance circuitry is configured to detect the net magnetic field as a combination of the reference magnetic field, the induced magnetic field when present, and the feedback magnetic field.

13. The sensor of claim 12, wherein the feedback loop comprises a modulator configured to modulate the output signal at a modulation frequency of the reference magnetic field and produce the feedback magnetic field at the reference frequency.

14. The sensor of claim 12, wherein the feedback loop comprises a gain correction unit configured to receive the output signal and adjust a strength of the feedback magnetic field based on the output signal.

15. The sensor of claim 1, wherein the main signal path includes an analog-to-digital converter configured to receive the output signal and produce the output signal as a digital output signal.

16. The sensor of claim 15, further comprising a feedback loop including a second coil and a second coil driver, wherein the feedback loop is configured to receive the output signal from the main signal path and produce a feedback magnetic field at the reference frequency, wherein the feedback loop includes a digital-to-analog converter configured to receive the digital output signal and produce the output signal as an analog signal for driving the second transmitting coil.

17. A method of detecting an open circuit state of a conductor using an inductive sensor, wherein the conductor includes a relay, wherein the relay has a closed state allowing current flow within the conductor and an open state preventing current flow within the conductor, the method comprising:

with a first transmitting coil disposed on an integrated circuit (IC) die within an IC package, producing a reference magnetic field at a reference frequency in response to receiving a drive current, wherein the reference magnetic field is configured to produce an induced current in the conductor when the relay is in the closed state;

with a first coil driver disposed within the IC package, producing the drive current and providing it to the first transmitting coil;

with magnetoresistance circuitry disposed within the IC package and configured to sense a net magnetic field as a combination of the reference magnetic field and an induced magnetic field generated by the induced current when present, producing an output signal corresponding to the net magnetic field; and with a main signal path connected to the magnetoresistance circuitry and configured to receive the output signal, determining whether the relay is in the closed state or the open state, wherein the inductive sensor includes a feedback loop including a second coil and a second coil driver, wherein the feedback loop is configured to receive the output signal from the main signal path and produce a feedback magnetic field at the reference frequency, and wherein the magnetoresistance circuitry is configured to detect the net magnetic field as a combination of the reference magnetic field, the induced magnetic field when present, and the feedback magnetic field.

18. The method of claim 17, wherein the conductor includes a coil portion disposed within the IC package.

19. The method of claim 17, further comprising adjusting a strength of the feedback magnetic field based on an ambient temperature change of the magnetoresistance circuitry.

20. A method of detecting an open circuit state of a conductor using an inductive sensor, wherein the conductor includes a relay, wherein the relay has a closed state allowing current flow within the conductor and an open state preventing current flow within the conductor, the method comprising:

with a first transmitting coil disposed on an integrated circuit (IC) die within an IC package, producing a reference magnetic field at a reference frequency in response to receiving a drive current, wherein the reference magnetic field is configured to produce an induced current in the conductor when the relay is in the closed state;

with a first coil driver disposed within the IC package, producing the drive current and providing it to the first transmitting coil;

with magnetoresistance circuitry disposed within the IC package and configured to sense a net magnetic field as a combination of the reference magnetic field and an induced magnetic field generated by the induced current when present, producing an output signal corresponding to the net magnetic field; and with a main signal path connected to the magnetoresistance circuitry and configured to receive the output signal, determining whether the relay is in the closed state or the open state, wherein the conductor is configured to conduct current having a frequency in a first frequency band, wherein producing the reference magnetic field includes producing the reference magnetic field with the reference frequency out of the first frequency band.

21. A method of detecting an open circuit state of a conductor using an inductive sensor, wherein the conductor includes a relay, wherein the relay has a closed state allowing current flow within the conductor and an open state preventing current flow within the conductor, the method comprising:

with a first transmitting coil disposed on an integrated circuit (IC) die within an IC package, producing a reference magnetic field at a reference frequency in response to receiving a drive current, wherein the reference magnetic field is configured to produce an induced current in the conductor when the relay is in the closed state;

with a first coil driver disposed within the IC package, producing the drive current and providing it to the first transmitting coil;

with magnetoresistance circuitry disposed within the IC package and configured to sense a net magnetic field as a combination of the reference magnetic field and an induced magnetic field generated by the induced current when present, producing an output signal corresponding to the net magnetic field; and with a main signal path connected to the magnetoresistance circuitry and configured to receive the output signal, determining whether the relay is in the closed state or the open state, wherein the conductor is configured to conduct current having a frequency in a first frequency band, wherein producing the reference magnetic field includes producing the reference magnetic field with the reference frequency within the first frequency band and with a spread spectrum sequence.

22. The method of claim 17, wherein the main signal path includes a comparator configured to perform a comparison of the output signal to a threshold value for determining whether the relay is in the closed state or the open state, and wherein the comparator is configured to produce an output signal indicative of a conduction state of the conductor.

23. An inductive sensor for sensing an open-circuit state of a conductor, the sensor comprising:

an integrated circuit (IC) disposed adjacent the conductor, the IC disposed on a die and including, a transmitting coil disposed within the IC and configured to produce a reference magnetic field at a reference frequency in response to receiving a drive current;

a coil driver circuit disposed within the IC and configured to produce the drive current and provide it to the transmitting coil;

magnetic field sensing circuitry including one or more magnetic field sensing elements disposed within the IC and configured to sense a net magnetic field as a combination of the reference magnetic field and an induced magnetic field generated by an induced current in the conductor when present and produce an output signal corresponding to the net magnetic field;

a main signal path connected to the magnetic field sensing circuitry configured to receive the output signal, wherein the main signal path is configured to determine, based on the out output signal, whether the conductor is in a closed or open state; and a feedback loop including a second coil and a second coil driver, wherein the feedback loop is configured to receive the output signal from the main signal path and produce a feedback magnetic field at the reference frequency, and wherein the magnetic field sensing circuitry is configured to detect the net magnetic field as a combination of the reference magnetic field, the induced magnetic field when present, and the feedback magnetic field.

24. The sensor of claim 23, wherein the IC is disposed in an IC package, wherein the IC package includes an in-package portion of the conductor.

25. The sensor of claim 24, wherein the in-package portion of the conductor comprises one or more coils.

26. The sensor of claim 23, wherein the one or more magnetic field sensing elements comprise a plurality of magnetic field sensing elements configured in a bridge.

27. The sensor of claim 26, wherein the plurality of magnetic field sensing elements comprises giant magnetore-sistance (GMR) elements.

28. The sensor of claim 26, wherein the plurality of magnetic field sensing elements comprises tunneling mag-netoresistance (TMR) elements.

29. The sensor of claim 26, wherein the plurality of magnetic field sensing elements comprises Hall effect ele-ments.

30. The sensor of claim 23, wherein the main signal path includes a comparator configured to perform a comparison of the output signal to a threshold value.

31. The sensor of claim 30, wherein the comparator is configured to indicate the open state of the conductor when the comparison indicates that the output signal exceeds the threshold value.

32. The sensor of claim 30, wherein the comparator is configured to indicate the closed state of the conductor when the comparison indicates that the output signal is less than the threshold value.

33. The sensor of claim 11, wherein the main signal path includes a comparator configured to perform a comparison of the output signal to a threshold value.

34. The sensor of claim 33, wherein the comparator is configured to indicate an open state of the relay based on the comparison.

35. The sensor of claim 11, wherein the output signal generated by the first transmitting coil is a modulated signal.

36. The sensor of claim 35, wherein the main signal path further includes a demodulator configured to demodulate the output signal and produce the output signal at baseband.

37. The sensor of claim 34, wherein the main signal path further comprising a low pass filter configured to receive the output signal.

38. The sensor of claim 11, wherein the magnetoresis-tance circuitry comprises a plurality of magnetoresistance (MR) elements configured in a bridge.

39. The sensor of claim 38, wherein the magnetoresis-tance circuitry comprises one or more giant magnetoresis-tance (GMR) elements.

40. The sensor of claim 38, wherein the magnetoresis-tance circuitry comprises one or more an anisotropic mag-netoresistance (AMR) elements.

41. The sensor of claim 38, where the magnetoresistance circuitry comprises one or more tunneling magnetoresis-tance (TMR) elements.

42. The method of claim 20, wherein the conductor includes a coil portion disposed within the IC package.

43. The method of claim 20, wherein the main signal path includes a comparator configured to perform a comparison of the output signal to a threshold value for determining whether the relay is in the closed state or the open state, and wherein the comparator is configured to produce an output signal indicative of a conduction state of the conductor.

44. The method of claim 21, wherein the conductor includes a coil portion disposed within the IC package.

45. The method of claim 21, wherein the main signal path includes a comparator configured to perform a comparison of the output signal to a threshold value for determining whether the relay is in the closed state or the open state, and wherein the comparator is configured to produce an output signal indicative of a conduction state of the conductor.

* * * * *